(12) United States Patent
Ranish et al.

(10) Patent No.: US 8,865,602 B2
(45) Date of Patent: Oct. 21, 2014

(54) EDGE RING LIP

(71) Applicant: Applied Materials, Inc., Santa Clara, CA (US)

(72) Inventors: Joseph M. Ranish, San Jose, CA (US); Wolfgang R. Aderhold, Cupertino, CA (US); Blake Koelmel, Mountain View, CA (US); Ilya Lavitsky, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 46 days.

(21) Appl. No.: 13/630,291

(22) Filed: Sep. 28, 2012

(65) Prior Publication Data

US 2014/0094039 A1    Apr. 3, 2014

(51) Int. Cl.
| | |
|---|---|
| *H01L 21/00* | (2006.01) |
| *F26B 19/00* | (2006.01) |
| *F26B 3/30* | (2006.01) |
| *H01L 21/687* | (2006.01) |
| *H01L 21/263* | (2006.01) |
| *H05B 3/00* | (2006.01) |
| *H01L 21/324* | (2006.01) |
| *H01L 21/67* | (2006.01) |

(52) U.S. Cl.
CPC ...... *H01L 21/68714* (2013.01); *H01L 21/2636* (2013.01); *H05B 3/0047* (2013.01); *H01L 21/324* (2013.01); *H01L 21/67115* (2013.01); *H01L 21/67248* (2013.01); *H01L 21/68735* (2013.01)
USPC ............ 438/795; 392/416; 392/418; 392/422

(58) Field of Classification Search
CPC ............................ H01L 21/324; H05B 3/0047
USPC ..................... 392/418, 416, 422; 437/14, 795
See application file for complete search history.

(56) References Cited

U.S. PATENT DOCUMENTS

| | | | |
|---|---|---|---|
| 5,169,453 A | 12/1992 | Takagi | |
| 5,169,684 A | * 12/1992 | Takagi | ........................ 427/248.1 |

(Continued)

FOREIGN PATENT DOCUMENTS

| | | |
|---|---|---|
| JP | 05-238882 A | 9/1993 |
| JP | 09-202969 A | 8/1997 |

(Continued)

OTHER PUBLICATIONS

International Search Report dated Dec. 12, 2013 for PCT/US13/055167.

*Primary Examiner* — Karen Kusumakar
(74) *Attorney, Agent, or Firm* — Patterson & Sheridan, LLP

(57) ABSTRACT

Embodiments of the invention generally relate to a support ring to support a substrate in a process chamber. In one embodiment, the support ring comprises an inner ring, an outer ring connecting to an outer perimeter of the inner ring through a flat portion, an edge lip extending radially inwardly from an inner perimeter of the inner ring to form a supporting ledge to support the substrate, and a substrate support formed on a top surface of the edge lip. The substrate support may include multiple projections extending upwardly and perpendicularly from a top surface of the edge lip, or multiple U-shaped clips securable to an edge portion of the edge lip. The substrate support thermally disconnects the substrate from the edge lip to prevent heat loss through the edge lip, resulting in an improved temperature profile across the substrate with a minimum edge temperature gradient.

14 Claims, 4 Drawing Sheets

(56) References Cited

U.S. PATENT DOCUMENTS

| | | | |
|---|---|---|---|
| 5,474,612 A * | 12/1995 | Sato et al. | 118/725 |
| 5,779,797 A * | 7/1998 | Kitano | 118/500 |
| 5,879,128 A | 3/1999 | Tietz et al. | |
| 5,960,555 A | 10/1999 | Deaton et al. | |
| 6,395,363 B1 | 5/2002 | Ballance et al. | |
| 6,494,955 B1 | 12/2002 | Lei et al. | |
| 6,888,104 B1 | 5/2005 | Ranish et al. | |
| 7,127,367 B2 | 10/2006 | Ramachandran et al. | |
| 7,256,375 B2 | 8/2007 | Oosterlaken | |
| 7,414,224 B2 | 8/2008 | Aderhold et al. | |
| 7,648,579 B2 | 1/2010 | Goodman et al. | |
| 7,704,327 B2 | 4/2010 | Waldhauer et al. | |
| 2003/0186563 A1 * | 10/2003 | Kobayashi et al. | 438/795 |
| 2004/0052512 A1 * | 3/2004 | Aderhold et al. | 392/418 |
| 2005/0191044 A1 * | 9/2005 | Aderhold et al. | 392/418 |
| 2008/0169282 A1 * | 7/2008 | Sorabji et al. | 219/444.1 |
| 2009/0103905 A1 * | 4/2009 | Tanino et al. | 392/411 |
| 2009/0255921 A1 | 10/2009 | Ranish et al. | |
| 2009/0274454 A1 | 11/2009 | Aderhold et al. | |
| 2011/0159211 A1 | 6/2011 | Du Bois et al. | |
| 2011/0250764 A1 | 10/2011 | Yokota et al. | |

FOREIGN PATENT DOCUMENTS

| | | |
|---|---|---|
| JP | 2003-59852 A | 2/2003 |
| KR | 2011-0137775 A | 12/2011 |

* cited by examiner

EDGE RING LIP

BACKGROUND OF THE INVENTION

1. Field of the Invention

Embodiments of the present invention generally relate to a support ring to support a substrate in a process chamber.

2. Description of the Related Art

In the processing of substrates, such as semiconducting substrates, the substrate is placed on a support in a process chamber and suitable processing conditions are maintained in the process chamber. For example, the substrate can be heated in a controlled heating cycle to thermally process the substrate. The substrate can be heated, for example, by an array of heating lamps disposed above and/or below the substrate in the chamber. Thermal processing can be used, for example, to anneal a layer that has been ion-implanted on the substrate, perform thermal oxidation or nitridation processes, or perform thermal chemical vapor deposition processes on the substrate.

It has been observed that variations in temperature gradients across the substrate can result in non-uniform processing of the substrate. Non-uniform temperatures occur at different substrate regions because of non-uniform convection or conduction heat losses from regions of the substrate in contact with the support (or other chamber components) and substrate regions not in contact with the support. The temperature gradients in the substrate have been reduced using a substrate support ring that extends inwardly from the chamber wall and surround a periphery of the substrate. Particularly, the substrate to be thermally processed is supported on its periphery by an edge of the support ring having an annular lip contacting the edge of the substrate. The support ring effectively expands or pushes out the temperature gradients in the substrate from the substrate periphery to the outer edges of the support ring. The overlapping of the substrate and the support ring also prevents or minimizes the leakage of the high-temperature radiant energy from the radiant heat source (disposed above the substrate) around the edge of the support ring on either its inner or outer side.

Support rings having an annular edge can fail to provide adequate temperature uniformity across the substrate in rapid heating rate processes, for example, processes having heating rates of at least about 200° C./second. In these processes, the difference in heating rates between the support ring and the substrate generates temperature gradients along the periphery of the substrate that become unacceptably high during the heating process step. The substrate may also experience azimuthal temperature variations caused by azimuthal variations in solid-solid thermal contact, largely by virtue of variable surface finish and planarity/flatness between the substrate and the support ring. In certain situations, since the substrate and the annular lip of the support ring overlap near the edge of the substrate, it is difficult to achieve uniform temperature profile near the edge by measuring and adjusting the temperature of the substrate alone. Depending on the support ring's thermal properties relative to the substrate's thermal and optical properties, the temperature profile of a substrate is generally either edge high or edge low. It is particularly difficult to achieve temperature uniformity across the substrate especially when the substrate is heated at rapid heating rates, such as in rapid thermal processing (RTP) systems.

Accordingly, it is desirable to have an improved support ring that prevents or minimizes any azimuthal variations in the overlap region between the substrate and the support ring so that the support ring does not generate excessive temperature gradients in a substrate during thermal processing.

SUMMARY OF THE INVENTION

Embodiments of the present invention generally relate to a support ring to support a substrate during thermal processing in a process chamber. In one embodiment, a substrate support ring is provided. The substrate support ring comprises a ring body, an edge lip extending radially inwardly of the ring body, and three or more substrate supports spaced equally around a circumference of the edge lip. The substrate supports may be projections extending upwardly and perpendicularly to a longitudinal axis of the edge lip from a top surface of the edge lip, or may be U-shaped clips securable to an edge portion of the edge lip. In either case, the height of the substrate supports is configured so that a gap between the back surface of the substrate and a top surface of the edge lip is large enough to thermally disconnect the edge lip from the substrate while minimized enough to prevent significant light passage.

In another embodiment, the support ring comprises an inner ring, an outer ring connecting to an outer perimeter of the inner ring through a flat portion, an edge lip extending radially inwardly from an inner perimeter of the inner ring to form a supporting ledge to support the substrate, and three or more substrate supports spaced equally around a circumference of the edge lip.

In yet another embodiment, a method of processing a substrate in a thermal processing chamber is provided. The method includes providing a substrate support ring having a ring body, an edge lip extending radially inwardly of the ring body, and supporting a back surface of a substrate near a peripheral edge of the substrate by three or more substrate supports spaced equally around a circumference of the edge lip, and heating the substrate by directing radiant energy towards the substrate, wherein the radiant energy is sufficient to cause at least the edge lip to bend upwards such that the three or more substrate supports make point contacts with the back surface of the substrate during the process.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally relate to a support ring to support a substrate during thermal processing in a process chamber. The substrate to be thermally processed is supported on its periphery by an edge lip of the support ring. The support ring extends radially inwardly along the inner circumferential surfaces of the process chamber and surrounds a periphery of the substrate. The support ring has an edge lip extends radially inwardly from a surface of the support ring. A portion of the edge lip is configured to support the periphery of the substrate from the back side while thermally disconnecting the substrate from the edge lip. As opposed to the conventional approach supporting the substrate about its entire periphery, the edge lip is provided with multiple substrate supports which make discrete line contacts or point contacts with the substrate, thereby reducing the contact area available for conductive transfer of heat between the lip portion of the support ring and the substrate, resulting in an improved temperature profile across the substrate with a minimum edge temperature gradient. As will be discussed in more detail below, the substrate support may be three or more projections or bumps formed on the top surface of the edge lip, or U-shaped clips for engaging the edge portion of the substrate. In various embodiments where a top heating configuration is adapted, the height of the substrate supports is optimized so that the gap between the back surface of the substrate and the top surface of the edge lip is large enough so that solid-solid contact is reduced to reduce or eliminate solid-solid conduction or the thermal coupling between the substrate and the edge ring support without light leakage (i.e., to prevent light of source radiation in the process chamber from reaching the pyrometer). Reduction of light leakage increases the accuracy of pyrometry while reduces the gas conduction in the overlap area.

In certain embodiments where a bottom heating configuration is adapted, the gap between the back surface of the substrate and the top surface of the edge lip should be just large enough so that solid-solid contact is reduced to eliminate solid-solid conduction and azimuthal vagaries of that type of contact, but no more since the edge lip still has to conduct heat to shaded outer perimeter of the substrate.

Exemplary Rapid Thermal Processing Chamber

Figure 1:
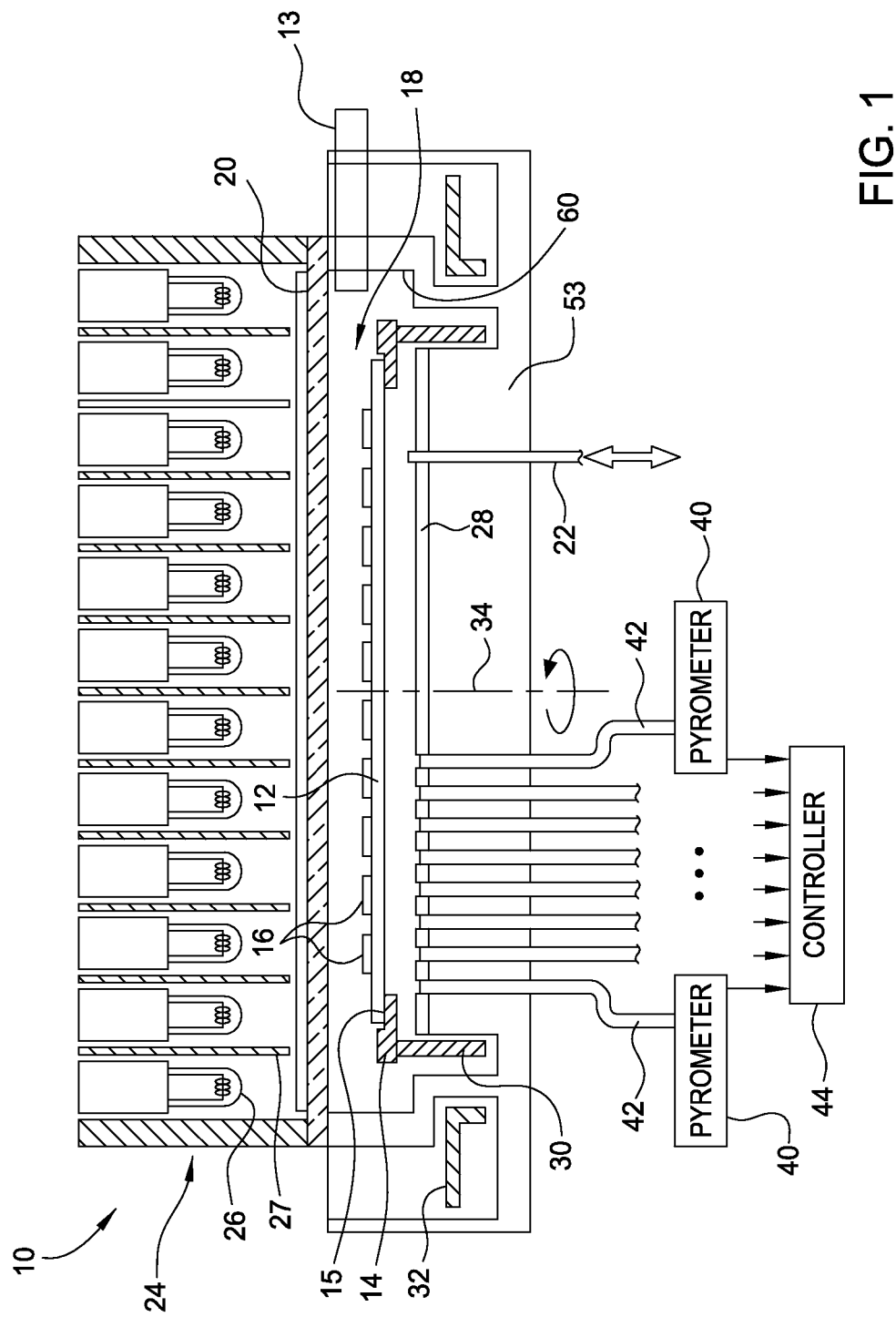
FIG. 1 schematically illustrates an exemplary rapid thermal processing chamber having a substrate support ring.

FIG. 1 schematically represents a rapid thermal processing chamber 10. A substrate 12, for example, a semiconductor substrate such as a silicon substrate to be thermally processed is passed through the valve or access port 13 into the process area 18 of the processing chamber 10. The substrate 12 is supported on its periphery by an annular support ring 14. An edge lip 15 extends inward of the annular support ring 14 and contacts the peripheral edge of the substrate 12. The substrate may be oriented such that processed features 16 already formed in a front surface of the substrate 12 face upwardly toward a process area 18 defined on its upper side by a transparent quartz window 20. That is, the front surface of the substrate 12 is facing toward the array of lamps 26. In some embodiments, the front surface of the substrate 12 with the processed featured formed thereon may face away from the array of lamps 26, i.e., facing towards the pyrometers 40. Contrary to the schematic illustration, the features 16 for the most part do not project substantial distances beyond the front surface of the substrate 12 but constitute patterning within and near the plane of the front surface.

A plurality of lift pins 22, such as three lift pins, may be raised and lowered to support the back side of the substrate 12 when the substrate is handed between a paddle or robot blade (not shown) bringing the substrate into the processing chamber and onto the support ring 14. A radiant heating apparatus 24 is positioned above the window 20 and configured to direct radiant energy toward the substrate 12 through the window 20. In the processing chamber 10, the radiant heating apparatus may include a large number, 409 being an exemplary number, of high-intensity tungsten-halogen lamps 26 positioned in respective reflective tubes 27 arranged in a hexagonal close-packed array above the window 20. The array of lamps 26 is sometimes referred to as the lamphead. However, it is contemplated that other radiant heating apparatus may be substituted. Generally, these involve resistive heating to quickly ramp up the temperature of the radiant source. Examples of suitable lamps include mercury vapor lamps having an envelope of glass or silica surrounding a filament and flash lamps which comprise an envelope of glass or silica surrounding a gas such as xenon, which provides a heat source when the gas is energized. As used herein, the term lamp is intended to cover lamps including an envelope that surrounds a heat source. The "heat source" of a lamp refers to a material or element that can increase the temperature of the substrate, for example, a filament or gas that can be energized, or a solid region of a material that emits radiation such as a LED or solid state lasers and laser diodes.

As used herein, rapid thermal processing or RTP refers to an apparatus or a process capable of uniformly heating a substrate at rates of about 50° C./second and higher, for example, at rates of about 100° C./second to 150° C./second, and about 200° C./second to 400° C./second. Typical rampdown (cooling) rates in RTP chambers are in the range of about 80° C./second to 150° C./second. Some processes performed in RTP chambers require variations in temperature across the substrate of less than a few degrees Celsius. Thus, an RTP chamber must include a lamp or other suitable heating system and heating system control capable of heating at rate of up to about 100° C./second to 150° C./second, and about 200° C./second to 400° C./second, distinguishing rapid thermal processing chambers from other types of thermal chambers that do not have a heating system and heating control system capable of rapidly heating at these rates. An RTP chamber with such a heating control system may anneal a sample in less than 5 seconds, for example, less than 1 second, and in some embodiments, milliseconds.

It is important to control the temperature across the substrate 12 to a closely defined temperature uniform across the substrate 12. One passive means of improving the uniformity may include a reflector 28 disposed beneath the substrate 12. The reflector 28 extends parallel to and over an area greater than the substrate 12. The reflector 28 efficiently reflects heat radiation emitted from the substrate 12 back toward the substrate 12 to enhance the apparent emissivity of the substrate 12. The spacing between the substrate 12 and the reflector 28 may be between about 3 mm to 9 mm, and the aspect ratio of the width to the thickness of the cavity is advantageously greater than 20. The top of reflector 28, which may be made of aluminum and has a highly reflective surface coating or multi-layer dielectric interference mirror, and the back side of the substrate 12 form a reflecting cavity for enhancing the effective emissivity of the substrate, thereby improving the accuracy of temperature measurement. In certain embodiments, the reflector 28 may have a more irregular surface or have a black or other colored surface to more closely resemble a black-body wall. The reflector 28 may be deposited on a second wall 53, which is a water-cooled base 53 made of metal to heat sink excess radiation from the substrate, especially during cool down. Accordingly, the process area of the processing chamber 10 has at least two substantially parallel walls, of which a first is a window 20, made of a material being transparent to radiation such as quartz, and the second wall 53 which is substantially parallel to the first wall and made of metal significantly not transparent.

One way of improving the uniformity includes supporting the support ring 14 on a rotatable cylinder 30 that is magnetically coupled to a rotatable flange 32 positioned outside the processing chamber 10. A motor (not shown) rotates the flange 32 and hence rotates the substrate about its center 34, which is also the centerline of the generally symmetric chamber. Alternatively, the bottom of the rotatable cylinder 30 may be magnetically levitated cylinder held in place by magnets disposed in the rotatable flange 32 and rotated by rotating magnetic field in the rotatable flange 32 from coils in the rotatable flange 32.

Another way of improving the uniformity divides the lamps 26 into zones arranged generally ring-like about the central axis 34. Control circuitry varies the voltage delivered to the lamps 26 in the different zones to thereby tailor the radial distribution of radiant energy. Dynamic control of the zoned heating is affected by, one or a plurality of pyrometers 40 coupled through one or more optical light pipes 42 positioned to face the back side of the substrate 12 through apertures in the reflector 28 to measure the temperature across a radius of the rotating substrate 12. The light pipes 42 may be formed of various structures including sapphire, metal, and silica fiber. A computerized controller 44 receives the outputs of the pyrometers 40 and accordingly controls the voltages supplied to the different rings of lamps 26 to thereby dynamically control the radiant heating intensity and pattern during the processing. Pyrometers generally measure light intensity in a narrow wavelength bandwidth of, for example, 40 nm in a range between about 700 to 1000 nm. The controller 44 or other instrumentation converts the light intensity to a temperature through the well-known Planck distribution of the spectral distribution of light intensity radiating from a black-body held at that temperature. Pyrometry, however, is affected by the emissivity of the portion of the substrate 12 being scanned. Emissivity ∈ can vary between 1 for a black body to 0 for a perfect reflector and thus is an inverse measure of the reflectivity R=1−∈ of the substrate back side. While the back surface of a substrate is typically uniform so that uniform emissivity is expected, the backside composition may vary depending upon prior processing. The pyrometry can be improved by further including a emissometer to optically probe the substrate to measure the emissivity or reflectance of the portion of the substrate it is facing in the relevant wavelength range and the control algorithm within the controller 44 to include the measured emissivity.

Exemplary Support Ring

Figure 2A:
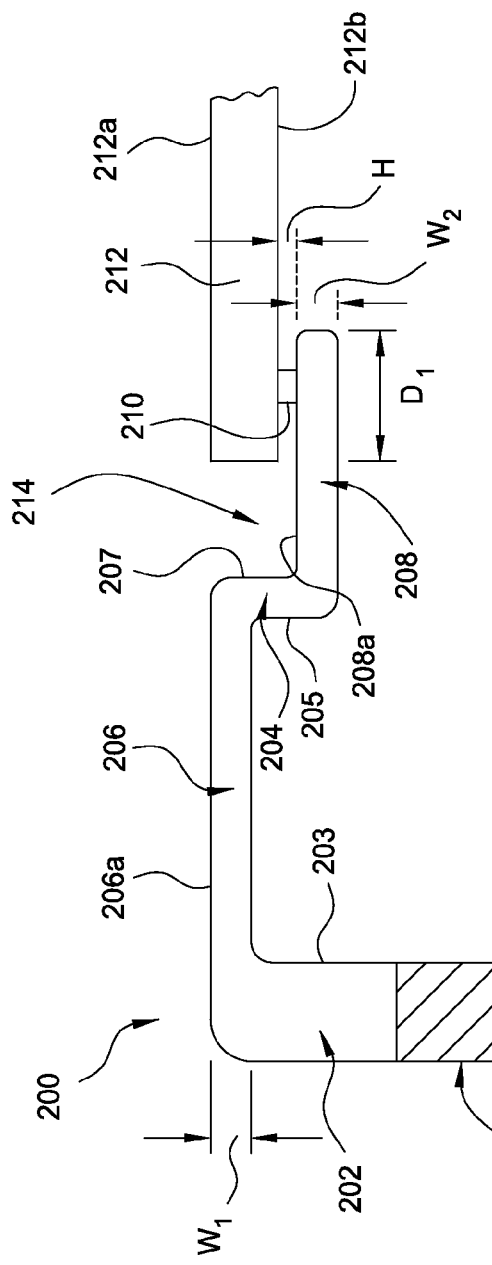
FIG. 2A schematically illustrates a cross-sectional side view of a support ring that may be used in place of the substrate support ring of FIG. 1 according to one embodiment of the invention.

FIG. 2A is a schematic cross-sectional side view of a support ring 200 that may be used in place of the support ring 14 of FIG. 1 according to one embodiment of the invention. The support ring 200 illustrated in FIG. 2A may be disposed within a processing chamber, for example a rapid thermal processing chamber 10 shown in FIG. 1, and extends radially inwardly along the inner circumferential surfaces 60 of the processing chamber 10. As will be discussed in various embodiments below, the support ring may be a continuous ring body (or discrete ring-like bodies in certain embodiments) which substantially surrounds a periphery of the substrate. The support ring surrounds an edge lip which has certain supporting features to make discrete point contacts with the back surface of the substrate. In some embodiments, the edge lip may have a radial width varying along the circumference of the support ring in order to control bending of the edge lip during the heating process. The radial width of the edge lip may vary depending upon the configuration of the heating lamps to minimize the light leakage problem. It should be noted that the substrate 212 is shown with a square edge for illustrative purpose only since the substrate 212 may have a rounded edge.

In one embodiment shown in FIG. 2A, the support ring 200 generally includes an outer ring 202 and an inner ring 204. The outer ring 202 connects to the inner ring 204 through a flat portion 206 which extends radially inwardly from an inner perimeter 203 of the outer ring 202 to an outer perimeter 205 of the inner ring 204. The outer ring 202 is supported by a cylinder 230, such as the rotatable cylinder 30 shown in FIG. 1. For a top-heating type configuration, the rotatable cylinder 230 may contact the support ring 200 just inward from the outer ring 202. That is, the bottom surface of the outer ring 202 is opposite to the top surface 206a of the flat portion 206 to prevent light leakage and provide required mechanical stability. The support ring 200 further includes an edge lip 208 which extends radially inwardly from an inner perimeter 207 of the inner ring 204 to form a supporting ledge to support the back surface 212b of the substrate 212 near a peripheral edge of the substrate 212. The edge lip 208 is sized according to the diameter of the substrate 212. For example, the edge lip 208 may extend a sufficient distance beneath the substrate 212, creating a radial overlap area "$D_1$" ranging between about 0.5 mm and about 5.0 mm for an nominal 12 inch (300 mm) substrate, such as between about 1.5 mm and about 2.8 mm, for example 0.8 mm. It is noted the term "overlap" as used in this disclosure is measured as shown as $D_1$ in FIG. 2A. The edge lip 208 may be a continuous ring shape with a consistent radial width. Alternatively, the edge lip 208 may have a radial width varying along the circumference of the support ring to reduce the amount of material used to make the edge lip while minimizing or eliminating bending of the edge lip during the heating process. The radial width of the edge lip 208 may vary depending upon the configuration of the heating lamps to minimize the light leakage problem (i.e., to prevent light of source radiation in the process chamber from reaching the pyrometer).

The top surface 208a of the edge lip 208 may be relatively below the top surface 206a of the flat portion 206 to form a recess 214 that is capable of holding the substrate 212 within the inner perimeter 207 of the inner ring 204. Specifically, the substrate is supported by the edge lip 208 through a substrate support 210 formed on the top surface 208a of the edge lip 208. The substrate support 210 may be located within the overlap area "$D_1$" between the substrate 212 and the edge lip 208. The substrate support 220 extends upwardly and perpendicularly to the longitudinal axis of the edge lip 208 from the top surface 208a. In one aspect, the upper surface of the inner ring 204 is at an elevation approximately the same as the upper surface 212a of the substrate 212.

Figure 2C:
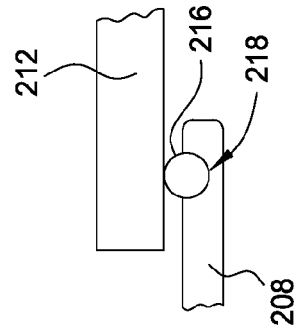
FIG. 2C schematically illustrates a cross-sectional side view of a substrate support using hemispherical-shaped bumps according to one embodiment of the invention.
Figure 2B:
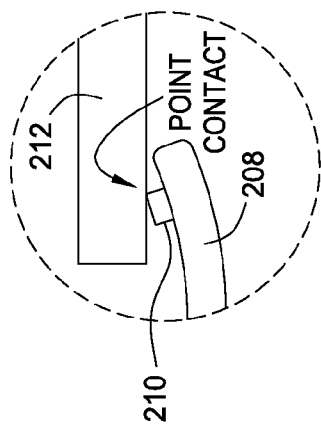
FIG. 2B schematically illustrates a cross-sectional side view of a substrate support of FIG. 2A bending slightly upwards to make discrete point contacts with the substrate due to the longitudinal bending distortion in an edge lip of the support ring.
Figure 2D:
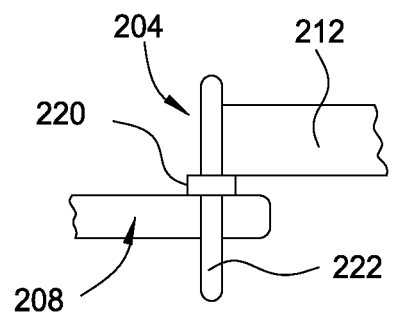
FIG. 2D schematically illustrates a cross-sectional side view of a substrate support using a pin according to one embodiment of the invention.
Figure 2E:
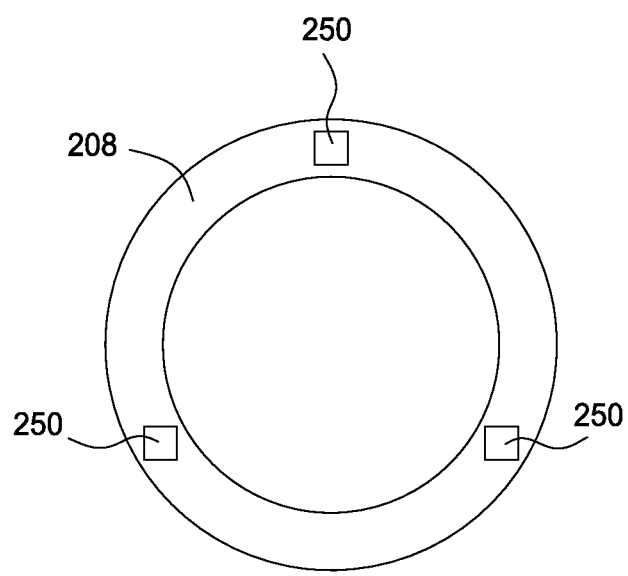
FIG. 2E schematically illustrates a top, partial view of an edge lip with three bumps or projections according to one embodiment of the invention.

In the embodiment shown in FIG. 2A, the substrate support 210 may include three or more bumps or projections that are spaced approximately equally as shown in FIG. 2E (which shows a top, partial view of the edge lip 208 with three bumps or projections 250), or distributed randomly, around the circumference of the edge lip 208. Upon rapid heating of the support ring 200, the flat portion 206 and/or edge lip 208 bend slightly upwards, as shown in FIG. 2B. The substrate supports 210 (i.e., bumps or projections) then turn what might have been a surface contact around the circumference of the edge lip 208 into a substantial line contact with the back surface 212b of the substrate 212 due to the longitudinal bending distortion in the edge lip 208. Contrary to the conventional approach where the substrate is supported by the edge lip about its entire periphery, the inventive bumps or projections therefore provide discrete line contacts for the substrate 212, which substantially reduces the contact area available for conductive transfer of heat between the edge lip 208 of the support ring 200 and the substrate 212. The bumps or projections thermally disconnect the substrate 212 from the edge lip 208 to prevent heat loss through the edge lip 208. Reducing the surface contact area between the substrate 212 and the support ring 200 would also allow for better management of the thermal mass discontinuity caused by the overlap of the substrate 212 and the edge lip 208. Therefore, the distortion of the thermal gradient generated by the heat loss around the edge of the substrate is reduced, and azimuthal temperature variations in the overlap region between the substrate 212 and the edge lip 208 is minimized, resulting in an improved temperature profile of across the substrate with a minimum edge temperature gradient. Reduced contact area between the edge lip 208 and the substrate 212 further reduces possible particle contamination in the processing chamber.

For top radiant heating arrangement as shown in FIG. 1, the radiation from the radiation heat source can be tailored just to heat up the substrate without worrying too much about the thermal mass discontinuity in the overlap region since the substrate is thermally disconnected from the edge lip 208 through the substrate supports 210. Therefore, the inventive substrate supports may translate to faster attainable heating ramp rates or reduced spike power situation. For bottom radiant heating arrangement (i.e., the substrate is held with its back surface 212b in opposition to a radiant heat source while its upper surface 212a on which the features such as integrated circuits face away from the radiant heat source), since the edge lip 208 is shielding the edge of the substrate 212, the edge lip 208 may need to be overheated in order for the heat to be conducted to the part of the substrate that is being shielded. Overheating the support ring 200, however, would render the edge lip 208 distort upwards too much or even cause undesired thermal stress or damages to the support ring. In that case, a stiffing rib (not shown) may be placed on the top surface 208a of the edge lip 208 to reduce the displacement of the edge lip 208 in the elevation direction by about an order of magnitude, such as about 1 mm to about 10 mm. Therefore, the azimuthal temperature variations in the overlap region between the edge lip and the substrate is reduced.

The bumps or projections may be formed on the top surface 208a of the edge lip 208 using a laser machining technique or any suitable technique. The bumps or projections may be any suitable shape such as rectangular, rhombus, square, hemispherical, hexagonal, triangular protrusions or mixtures of differently shaped protrusions. In one example, the substrate support 210 is square-shaped bumps or projections. In another example, the substrate support 210 is hemispherical-shaped bumps or projections. FIG. 2C illustrates an example where the hemispherical-shaped bumps 216 are used as the substrate support. Hemispherical-shaped bumps or projections may be more advantageous in terms of effective thermal mass reduction since hemispherical-shaped bumps or projections are able to further reduce the surface contact area between the edge lip and the substrate by turning the surface contact or line contact into a point contact. In such an example, a recess 218 may be formed in the top surface 208a of the edge lip 208 to accommodate the hemispherical-shaped bumps 216. It is contemplated that the bumps or projections need not be a perfect hemisphere, square etc. The shape and/or dimension of the substrate support 210 may vary so long as the substrate 212 is supported securely with minimized contact area between the substrate support 210 and the back surface 212b of the substrate 212. In cases where a square protrusion is used, the dimensions of the substrate support 210 may vary over broad limits between about 0.1 mm and about 10 mm, such as between about 0.2 mm and about 2 mm, for example about 1 mm in width.

As noted above, substrate temperature in the process area of a processing chamber is commonly measured by radiation pyrometry, such as the pyrometers 40 of FIG. 1. While radiation pyrometry can be highly accurate, radiation which is within the radiation pyrometer bandwidth and which originates from the heating source may interfere with the interpretation of the pyrometer signal from the substrate if this radiation is detected by the pyrometer. Therefore, the height of the substrate support 210, e.g., the bumps or projections in this embodiment, needs to be configured so that the gap "H" between the back surface 212b of the substrate 212 and the top surface 208a of the edge lip 208 is large enough to thermally disconnect the substrate 212 from the edge lip 208 while minimized enough to prevent significant light leakage from the source radiation (not shown) around the suspended substrate 212 to the underlying pyrometers. In various embodiments where a top heating configuration is used, the substrate support 210 (or the gap "H") may be about 50 microns to about 300 microns in maximum height, for example about 100 microns. Not only the presence of the substrate support 210 blocks most light coming from the source radiation, the amount of light reaching to the pyrometers may be further limited by increasing the distance of the radial overlap area "$D_1$" between the substrate 212 and the edge lip 208 so that the light has to travel radially inward far in order to make it to the pyrometers. Therefore, the light leakage problem is minimized.

The dimensions of the support ring 200 are selected to provide a suitable thermal mass ($T_m$). For example, the dimensions can be selected to provide a mass equivalent to a mass of from about 4 g to about 40 g, such as about 20 g to process a substrate having a diameter of 300 mm and a substrate absorptivity of about 0.95, giving a thermal mass ($T_m$) of from about 2 J/K to about 750 J/K. For example, the thermal mass can be equivalent to a thermal mass of from about 3 J/K to about 45 J/K, for an irradiated ring surface area of from about $2\times10^{-3}$ m$^2$ to about $3\times10^{-2}$ m$^2$, to process a substrate having a diameter of about 300 mm and an absorptivity of about 1.0. As another example, the thermal mass can be equivalent to a thermal mass of from about 30 J/K to about 450 J/K, for an irradiated ring surface area of from about $3\times10^{-3}$ m$^2$ to about $3\times10^{-2}$ m$^2$, to process a substrate having a diameter of about 300 mm and an absorptivity of about 0.1. In one aspect, the thermal mass of the support ring 200 is from about 4 J/K to about 44 J/K, such as about 23 J/K. The dimensions can be selected by, for example, increasing or decreasing the thickness of one or more of the flat portion 206 and edge lip 208. For example, a suitable thickness ($W_1$) of the flat portion 206 may be a thickness equivalent to a thickness of about $2.3 \times 10^{-4}$ m to about $8.2 \times 10^{-4}$ m, such as between about $3.3 \times 10^{-4}$ m and about $5.1 \times 10^{-4}$ m; and a suitable thickness ($W_2$) of the edge lip 208 may be a thickness equivalent to a thickness of about $1.8 \times 10^{-4}$ m to about $4.5 \times 10^{-4}$ m, such as between about $1.3 \times 10^{-4}$ m and about $2.5 \times 10^{-4}$ m, to process a substrate having a diameter of about 300 mm. The diameter of the flat portion 206 or edge lip 208, as well as the dimensions of the outer ring 202 and inner ring 204, can also be adjusted to provide a desired thermal mass. Furthermore, it has been discovered that maintaining a ratio of the flat portion thickness ($W_1$) to the edge lip thickness ($W_2$) from about 1.14 to about 1.3 may be desirable to provide a good distribution of thermal mass in the support ring 200 and reduce temperature gradients in the substrate 212.

The substrate support 210 may be made of a material that is transparent to radiation in the frequency range used for temperature measurements of the substrate. In one example, the substrate support 210 is made of silicon carbide. Other materials, such as silicon carbide alloys, ceramics, or high temperature materials such as amorphous silica, $Al_2O_2$, $ZrO_2$, $Si_3N_4$, or similar material, are also contemplated. The support ring 200 may be made of a material similar to the substrate so as to minimize absorptivity/reflectance mismatch between the substrate and the support ring. In one example, the support ring 200 is made of silicon carbide. In certain embodiments, the support ring 200 may be optionally coated with a layer of polycrystalline silicon (polysilicon) to render it opaque to radiation in a frequency range used for a temperature measurement of a substrate in a thermal processing chamber. In such a case, the thickness of a polysilicon layer may vary ranging between about 20 μm and about 50 μm, depending upon the thickness of the support ring 200, or depending on opacity of SiC, for example, that is used in the support ring 200.

Figure 3A:
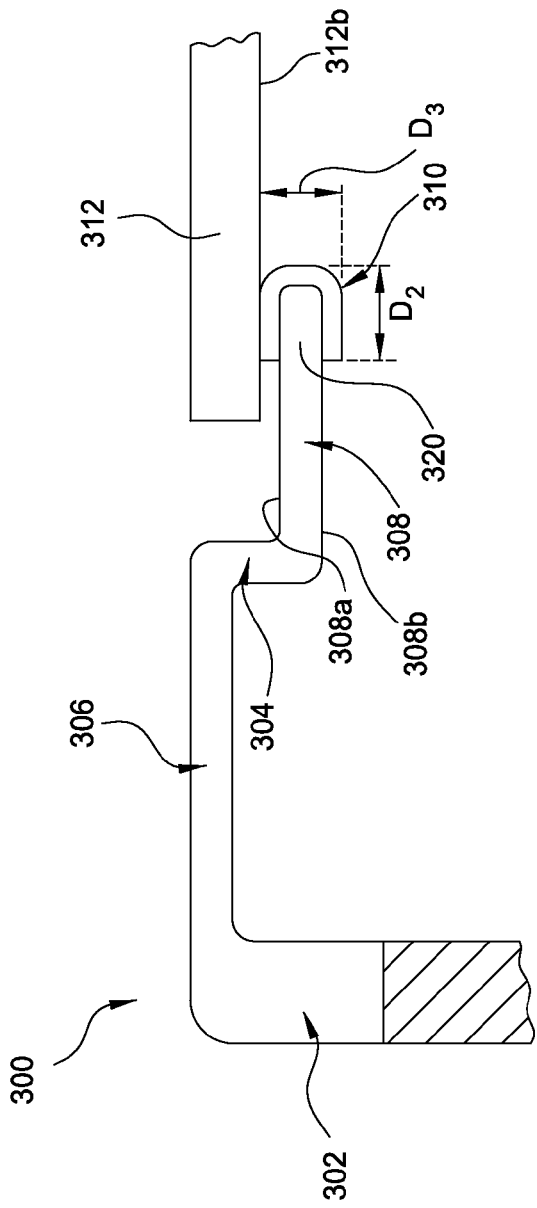
FIG. 3A schematically illustrates a cross-sectional side view of a support ring that may be used in place of the support ring of FIG. 1 according to another embodiment of the invention.

FIG. 3A is a schematic cross-sectional side view of a support ring 300 that may be used in place of the support ring 14 of FIG. 1 according to another embodiment of the invention. The support ring 300 generally includes an outer ring 302 and an inner ring 304. In general, the support ring 300 is identical to the support ring 200 of FIG. 2A except that the substrate support 210 is replaced by a plurality of substrate supports 310 securable to an edge portion 320 of the edge lip 308. The substrate supports 310 may include three or more U-shaped clips distributed randomly, or spaced substantially equally around the circumference of the edge lip 308 in a way as shown in FIG. 2E, for example. The substrate supports 310 are adapted to be secured to at least portions of the top surface 308a and back surface 308b of the edge lip 308 around the circumference of the edge lip 308.

Figure 3B:
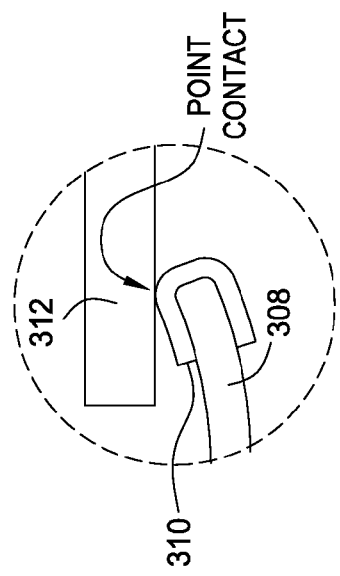
FIG. 3B schematically illustrates a cross-sectional side view of a substrate support of FIG. 3A bending slightly upwards to make discrete point contacts with the substrate due to the longitudinal bending distortion in an edge lip of the support ring.

Similar to the substrate support 210, the flat portion 306 and/or edge lip 308 bend slightly upwards upon rapid heating of the support ring 300. Due to the longitudinal bending distortion in the edge lip 308, the U-shaped clips turn what might have been a surface contact between the substrate support 210 and the substrate 312 into a substantial line contact or even a point contact with the back surface 312b of the substrate 312, as shown in FIG. 3B. In other words, the substrate supports 310 play a role similar to that of the substrate support 210 of FIG. 2A by supporting the back surface 312b of the substrate 312 with minimized contact area while thermally disconnecting the substrate 312 from the edge lip 308, thereby reducing heat loss through the edge lip 308. The U-shaped clips may be clipped onto the edge portion 320 of the edge lip 308 with lateral tension. The rotation of the support ring will keep the U-shaped clips on the edge lip 308. Any suitable adhesive (not shown) or foreseeable fastening mechanism such as a bolt may be added in the edge lip 308 to prevent potential particle generation issues or to prevent the U-shaped clips from falling off during the process.

The dimensions of the U-shaped clips may vary depending upon the thickness of the edge lip 308. In one embodiment, the U-shaped clips may have a length "$D_2$" of about 0.5 mm to about 5.0 mm, a width of about 0.05 mm to about 5 mm, and a height "$D_3$" of about 0.1 mm to about 0.6 mm plus the edge lip thickness, which may be of about 0.05 mm to about 0.3 mm. In one example, the bottom of the U-shaped clip may extend beyond the edge lip 308 and bend upwards to help hold it in position. In such a case, the length of bottom part of the U-shaped clip can be a bit greater than length of edge lip 308. The U-shaped clips may have a thickness of about 0.05 mm to about 0.15 mm, such as about 0.1 mm. Similarly, the substrate support 310 may be made of a material identical to the substrate support 210 of FIG. 2A. For example, the substrate support 310 may be made of silicon carbide, ceramics, or high temperature materials such as amorphous silica, $Al_2O_2$, $ZrO_2$, and $Si_3N_4$.

Although exemplary embodiments of the present invention are shown and described, those of ordinary skill in the art may devise other embodiments which incorporate the present invention, and which are also within the scope of the present invention. For example, in certain embodiments the bumps or projections may be attached to, or formed as an integral part of a pin 222 to be dropped into a hole (not shown) formed through the edge lip 208 to prevent the bumps or projections from lateral movement, as shown in FIG. 2D. The pin 222 may be extended from the side of the bumps or projections opposing the side in contact with the edge lip 208 to form an upper lift pin portion 224 such that the edge of the substrate 212 is reliably held in place against the upper lift pin portion 224 over the bumps or projections for self-centering purpose. Furthermore, it is contemplated that the substrate support may be any variations other than the projections or U-shaped clips as discussed, such as glued fibers, embedded objects, protruding pins, slanted pins, or the like that may be secured onto the edge lip of the support ring to support the back surface of a substrate near a peripheral edge with minimized contact area between the edge lip and the substrate.

While the foregoing is directed to embodiments of the present invention, other and further embodiments of the invention may be devised without departing from the basic scope thereof, and the scope thereof is determined by the claims that follow.

The invention claimed is:

1. A substrate support ring, comprising:
   a ring body;
   an edge lip extending radially inwardly from a surface of the ring body; and
   three or more substrate supports spaced approximately equally around a circumference of the edge lip, wherein the substrate supports are U-shaped clips.

2. A substrate support ring, comprising:
   a ring body;
   an edge lip extending radially inwardly from a surface of the ring body; and
   three or more substrate supports spaced approximately equally around a circumference of the edge lip, wherein the substrate supports are U-shaped clips securable to an edge portion of the edge lip.

3. The support ring of claim 2, wherein the U-shaped clips have a thickness of about 0.05 mm to about 0.3 mm.

4. A substrate support ring, comprising:
   an inner ring;
   an outer ring connecting to an outer perimeter of the inner ring through a flat portion;

an edge lip extending radially inwardly from an inner perimeter of the inner ring to form a supporting ledge; and three or more substrate supports spaced approximately equally around a circumference of the edge lip, wherein the substrate supports are U-shaped clips.

5. The support ring of claim 4, wherein the flat portion extends radially inwardly from an inner perimeter of the outer ring to the outer perimeter of the inner ring.

6. A substrate support ring, comprising:
an inner ring;
an outer ring connecting to an outer perimeter of the inner ring through a flat portion;
an edge lip extending radially inwardly from an inner perimeter of the inner ring to form a supporting ledge; and
three or more substrate supports spaced approximately equally around a circumference of the edge lip, wherein the substrate supports are U-shaped clips securable to an edge portion of the edge lip.

7. The support ring of claim 6, wherein the U-shaped clips have a thickness of about 0.05 mm to about 0.15 mm.

8. The support ring of claim 4, wherein the substrate supports are made of silicon carbide, silicon carbide alloys, ceramics, amorphous silica, $Al_2O_3$, $ZrO_2$, $Si_3N_4$, or a combination thereof.

9. A method of processing a substrate in a thermal processing chamber, comprising:
providing a substrate support ring having a ring body and an edge lip extending radially inwardly from a surface of the ring body;
supporting a back surface of a substrate near a peripheral edge of the substrate by three or more substrate supports spaced approximately equally around a circumference of the edge lip, wherein the three or more substrate supports are U-shaped clips and are in contact with the edge lip; and
heating the substrate by directing radiant energy towards the substrate, wherein the radiant energy is sufficient to cause at least the edge lip to bend upwards such that the three or more substrate supports make point contacts with the back surface of the substrate during the process.

10. The method of claim 9, wherein the edge lip extends a distance beneath the back surface of the substrate for about 0.5 mm to about 5.0 mm.

11. A method of processing a substrate in a thermal processing chamber, comprising:
providing a substrate support ring having a ring body and an edge lip extending radially inwardly from a surface of the ring body;
supporting a back surface of a substrate near a peripheral edge of the substrate by three or more substrate supports spaced approximately equally around a circumference of the edge lip, wherein the three or more substrate supports are U-shaped clips securable to an edge portion of the edge lip; and
heating the substrate by directing radiant energy towards the substrate, wherein the radiant energy is sufficient to cause at least the edge lip to bend upwards such that the three or more substrate supports make point contacts with the back surface of the substrate during the process.

12. The method of claim 9, wherein the height of the substrate supports is configured so that a gap between the back surface of the substrate and a top surface of the edge lip is large enough to thermally disconnect the edge lip from the substrate while minimized enough to prevent significant light passage.

13. The method of claim 9, wherein the radiant energy is directed from a radiation heat source disposed above an upper surface of the substrate.

14. The method of claim 9, wherein the radiant energy is directed from a radiation heat source disposed below a back surface of the substrate.

* * * * *